(12) United States Patent
Seo

(10) Patent No.: US 11,177,331 B2
(45) Date of Patent: Nov. 16, 2021

(54) SEMICONDUCTOR DEVICE AND DISPLAY DEVICE HAVING THE SAME

(71) Applicant: Samsung Display Co., Ltd., Yongin-si (KR)

(72) Inventor: Hae Kwan Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/563,576

(22) Filed: Sep. 6, 2019

(65) Prior Publication Data

US 2020/0135821 A1 Apr. 30, 2020

(30) Foreign Application Priority Data

Oct. 30, 2018 (KR) .......................... 10-2018-0131175

(51) Int. Cl.
*H01L 27/32* (2006.01)
*H01L 51/00* (2006.01)

(52) U.S. Cl.
CPC ...... *H01L 27/3248* (2013.01); *H01L 27/3262* (2013.01); *H01L 51/0097* (2013.01)

(58) Field of Classification Search
None
See application file for complete search history.

(56) References Cited

U.S. PATENT DOCUMENTS

| 8,368,202 | B2* | 2/2013 | Chiu | H01L 24/05 257/698 |
| 8,552,548 | B1* | 10/2013 | Do | H01L 24/02 257/698 |
| 9,461,029 | B2* | 10/2016 | Jang | H01L 25/0657 |
| 9,788,429 | B2 | 10/2017 | Hong et al. | |
| 9,991,219 | B2 | 6/2018 | Seol et al. | |
| 10,140,949 | B2 | 11/2018 | Seo | |
| 2006/0087028 | A1* | 4/2006 | Goto | H01L 23/49816 257/723 |
| 2013/0249589 | A1* | 9/2013 | Chen | H01L 21/486 324/762.01 |

FOREIGN PATENT DOCUMENTS

| KR | 10-2016-0052922 A | 5/2016 |
| KR | 10-2018-0000655 A | 1/2018 |
| KR | 10-2018-0005319 A | 1/2018 |

* cited by examiner

*Primary Examiner* — Robert K Carpenter
(74) *Attorney, Agent, or Firm* — Lewis Roca Rothgerber Christie LLP

(57) ABSTRACT

A semiconductor device includes: a semiconductor chip including a substrate having a first surface and a second surface, which are opposite to each other; a through hole penetrating the substrate; a first conductive pad on the first surface of the substrate; a first bump formed over and electrically connected to the first conductive pad; a second conductive pad on the second surface of the substrate; a second bump formed over and electrically connected to the second conductive pad; and a connection electrode buried in the through hole, the connection electrode electrically connecting the first bump and the second bump.

22 Claims, 12 Drawing Sheets

SEMICONDUCTOR DEVICE AND DISPLAY DEVICE HAVING THE SAME

CROSS-REFERENCE TO RELATED APPLICATION

The present application claims priority to and the benefit of Korean patent application 10-2018-0131175 filed on Oct. 30, 2018 in the Korean Intellectual Property Office, the entire disclosure of which is incorporated herein by reference.

BACKGROUND

1. Field

Aspects of some example embodiments of the present disclosure generally relate to a semiconductor device and a display device having the same.

2. Description of the Related Art

There have been developed various display devices used for multimedia devices, such as televisions, cellular phones, tablet computers, navigation systems, and game consoles. The display devices include a display panel for displaying an image.

A display device generally includes a display panel for displaying an image and a driver for generating various signals or data for driving the display panel. The driver generally includes various circuits and electronic elements, and may be mounted on the display panel to be electrically connected to an external printed circuit board.

Meanwhile, various electronic elements such as a controller for generating a signal for controlling the driver, a power supply for supplying power to the driver, and a memory may be mounted on the printed circuit board. For example, when the electronic elements are implemented in one printed circuit board, a limitation may occur due to a problem that the thickness and size of the printed circuit board increase. In addition, it may be difficult to secure a distance between adjacent electronic elements, and therefore, a problem may occur in terms of reliability, etc.

The Background section of the present Specification includes information that is intended to provide context to example embodiments, and the information in the present Background section does not necessarily constitute prior art.

SUMMARY

Aspects of some example embodiments may include a display device in which some electronic elements on a printed circuit board are mounted directly on a semiconductor device, so that the printed circuit board can be reused while securing an effective area of the printed circuit board.

According to some example embodiments of the present disclosure, a semiconductor device includes: a semiconductor chip including a substrate having a first surface and a second surface, which are opposite to each other; a through hole penetrating the substrate; a first conductive pad on the first surface of the substrate; a first bump formed over and electrically connected to the first conductive pad; a second conductive pad on the second surface of the substrate; a second bump formed over and electrically connected to the second conductive pad; and a connection electrode buried in the through hole, the connection electrode electrically connecting the first bump and the second bump.

The first bump and the second bump may have different sizes. The size of the second bump may be larger than that of the first bump.

The semiconductor device may include at least one passive element on the second bump.

The passive element may include at least one of a bypass capacitor and a decoupling capacitor.

The first and second bumps may include at least one metal layer.

The semiconductor device may further include: a first conductive medium layer between the first bump and the first conductive pad; and a second conductive medium layer between the second bump and the second conductive pad.

According to another aspect of the present disclosure, there is provided a display device including: a substrate having a display area and a non-display area; a printed circuit board including a transmitting controller configured to output input image data, a wireless data generator configured to convert the input image data into a data transmission signal, and a wireless transmitting pad unit configured to wirelessly transmit the data transmission signal as wireless data, the printed circuit board being separated from the substrate; a radio receiving array in the non-display area of the substrate, the radio receiving array including a wireless receiving pad unit that is coupled to the wireless transmitting pad unit and configured to output a data reception signal by receiving the wireless data, and a wireless data restoring unit configured to convert the data reception signal into restored image data; and a semiconductor device in the non-display area of the substrate, the semiconductor device configured to convert the restored image data into a voltage, wherein the semiconductor device includes: a semiconductor chip including a semiconductor substrate having a first surface and a second surface, which are opposite to each other; a through hole penetrating the semiconductor substrate; a first conductive pad on the first surface of the semiconductor substrate; a first bump formed over and electrically connected to the first conductive pad; a second conductive pad on the second surface of the semiconductor substrate; and a second bump formed over and electrically connected to the second conductive pad.

The semiconductor device may include: a semiconductor chip including a semiconductor substrate having a first surface and a second surface, which are opposite to each other; a through hole provided to penetrate the semiconductor substrate; at least one first conductive pad on the first surface of the semiconductor substrate; at least one first bump on the top of the first conductive pad to be electrically connected to a corresponding first conductive pad; at least one second conductive pad on the second surface of the semiconductor substrate; and at least one second bump on the top of the second conductive pad to be electrically connected to a corresponding second conductive pad.

The display device may further include a connecting electrode buried in the through hole, the connection electrode electrically connecting the first bump and the second bump.

The first bump and the second bump may have different sizes. The size of the second bump may be larger than that of the first bump.

The display device may include at least one passive element on the second bump of the semiconductor device. The passive element may include at least one of a bypass capacitor and a decoupling capacitor.

The first and second bumps may include at least one metal layer.

The display device may further include a chip on film on the semiconductor device to be electrically connected to the second bump. At least one passive element is on one surface of the chip on film.

One side surface of the chip on film may be connected to the printed circuit board, and the semiconductor device and the printed circuit board may be electrically connected through the chip on film.

The display device may further include a flexible printed circuit board provided on the semiconductor device to be electrically connected to the second bumps. At least one passive element and at least one active element may be on one surface of the flexible printed circuit board.

The substrate may include a lower surface and an upper surface, which are opposite to each other. The semiconductor device may be provided in the non-display area on the upper surface of the substrate.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
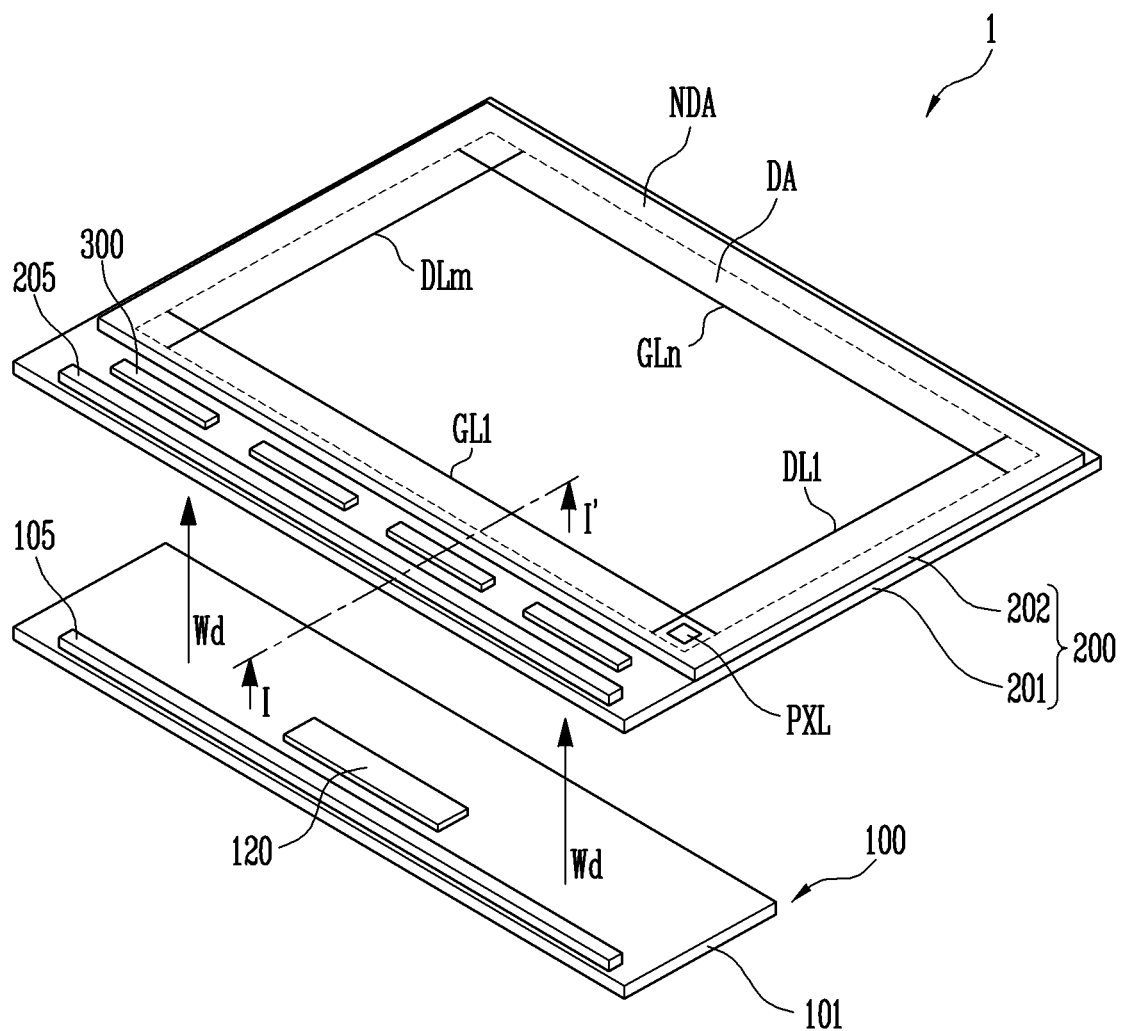
FIG. 1 is a schematic perspective view illustrating a display device according to some example embodiments of the present disclosure.
Figure 1:
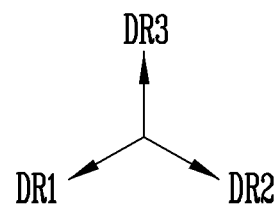

The present disclosure may apply various changes and different shape, therefore only illustrate certain details with the example embodiments. However, the examples do not limit to certain shapes but apply to all the change and equivalent material and replacement. The drawings included are illustrated in a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in more detail with reference to the accompanying drawings.

Figure 2:
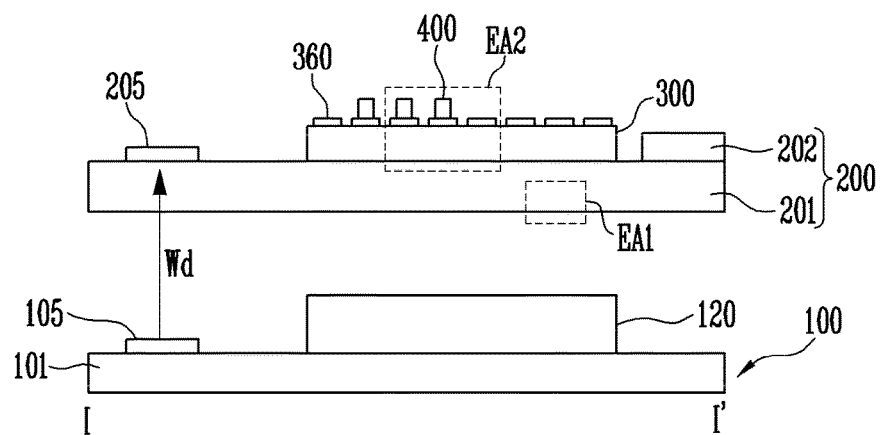
FIG. 2 is a sectional view taken along the line I-I' of FIG. 1.

FIG. 1 is a schematic perspective view illustrating a display device according to some example embodiments of the present disclosure. FIG. 2 is a sectional view taken along the line I-I' of FIG. 1.

Referring to FIGS. 1 and 2, the display device 1 according to some example embodiments of the present disclosure may be provided in various shapes. For example, the display device 1 may be provided in a quadrangular plate shape having two pairs of sides parallel to each other. When the display device 1 is provided in the rectangular plate shape, any one pair of sides among the two pairs of sides may be provided longer than the other pair of sides. In some example embodiments of the present disclosure, a case where the display device 1 is provided in a rectangular shape having a pair of long sides and a pair of short sides is illustrated for convenience of description. The extending direction of the short side is represented as a first direction DR1, the extending direction of the long side is represented as a second direction DR2, and a direction orthogonal to the first and second directions DR1 and DR2 is represented as a third direction DR3.

The display device 1 may include a printed circuit board 100 and a display panel 200 overlapping with the printed circuit board 100 in the thickness direction thereof.

In some example embodiments of the present disclosure, the display panel 200 may include a display area DA and a non-display area NDA. An image may be displayed in the display area DA, and the display area DA may include a plurality of pixels PXL. In FIG. 1, only one pixel PXL is illustrated as an example, and illustration of the other pixels PXL is omitted, but various numbers of pixels PXL may be included according to the design and size of the display panel 200.

The image may not be displayed in the non-display area NDA. Lines, a driving circuit, and a driving element, which are configured to drive the pixels PXL, may be located in the non-display area NDA. The non-display area NDA may surround, for example, at least a portion of the display area DA. In some embodiments, the non-display area NDA may define a bezel of the display device 1.

The display panel 200 includes gate lines GL1 to GLn, data lines DL1 to DLm, and the pixels PXL. The gate lines GL1 to GLn extend along, for example, the second direction DR2, and are arranged along the first direction DR1. The data lines DL1 to DLm intersect the gate lines GL1 to GLn to be insulated from the gate lines GL1 to GLn. For example, the data lines DL1 to DLm may extend along the first direction DR1, and be arranged along the second direction DR2. The first and second directions DR1 and DR2, for example, may intersect each other. In an embodiment of the present disclosure, the thickness direction of the display panel 200 may be parallel to the third direction DR3.

Each of the pixels PXL is connected to a corresponding gate line among the gate lines GL1 to GLn and a corresponding data line among the data lines DL1 to DLm. The pixels PXL may be arranged in a matrix form along the first and second directions DR1 and DR2. Each pixel PXL may include a plurality of sub-pixels capable of expressing any one of primary colors such as red, green, and blue. The color that can be expressed by the sub-pixels is not limited to the red, green, and blue, and the sub-pixels may express various colors including secondary primary colors such as yellow, cyan, and magenta.

Each pixel PXL is an element for displaying a unit image, and a resolution of the display panel 200 may be determined according to the number of pixels PXL provided in the display panel 200.

The display panel 200 may include a first substrate 201 and a second substrate 202 located on the first substrate 201. The second substrate 202 may be an encapsulation means that covers the first substrate 201 to prevent or reduce introduction of moisture and oxygen from the outside. In some embodiments, the second substrate 202 may be configured as an encapsulation substrate joined with the first substrate 201, using a sealant, or be a thin encapsulation film formed directly on the first substrate 201.

Also, the display panel 200 may include a wireless receiving array 205 arranged on the first substrate 201 and a semiconductor device 300 arranged on the first substrate 201. The wireless receiving array 205 and the semiconductor device 300 may be located in the non-display area NDA of the display panel 200.

The semiconductor device 300 may be spaced apart from the display area DA of the display panel 200 in the first direction DR1. When viewed on a plane, the semiconductor device 300 may be located between the wireless receiving array 205 and the display area DA, but the position of the semiconductor device 300 is not limited thereto. In some example embodiments of the present disclosure, the semiconductor device 300 may be, for example, a data driver integrated circuit (IC) for transferring a data voltage to the pixels PXL. The semiconductor device 300 may include one surface (hereinafter, referred to as a 'lower surface') in direct contact with the display panel 200 and an upper surface located above the lower surface while facing the lower surface along the third direction DR3.

The wireless receiving array 205 may be spaced apart from the display area DA of the display panel 200 in the first direction DR1, and be arranged along one end of the first substrate 201.

The printed circuit board 100 may include a base circuit substrate 101, a wireless transmitting array 105 arranged on the base circuit substrate 101, and a circuit element 120 located on one surface of the base circuit substrate 101. In some example embodiments of the present disclosure, the circuit element 120 may include an active element such as a memory implemented with an IC chip or a microprocessor. The circuit element 120 may include, for example, a main processor of the display device 1. The main processor may control overall operations of the display panel 200. For example, the main processor receives input image signals input from the outside, and generates input image data by changing a data format of the input image signals to be suitable for interface specifications and driving modes of the semiconductor device 300.

For example, the wireless transmitting array 105 may be spaced apart from the circuit element 120 in the first direction DR1, and be arranged along one end of the base circuit substrate 101. The wireless transmitting array 105 may overlap with the wireless receiving array 205 in the thickness direction D3.

The wireless transmitting array 105 may receive input image data, and wirelessly transmit the input image data as wireless data Wd to the wireless receiving array 205.

The wireless receiving array 205 may receive the wireless data Wd, converts the wireless data Wd into restored image data, and output the restored image data to the semiconductor device 300. The semiconductor device 300 may convert the restored image data received from the wireless receiving array 205 into a data voltage, and output the data voltage to corresponding pixels PXL.

The wireless transmitting array 105 may wirelessly transmit power to the wireless receiving array 205.

In an embodiment of the present disclosure, the wireless transmitting array 105 and the wireless receiving array 205 are not physically connected. In other words, a current path through which current flows is not directly formed in the wireless transmitting array 105 and the wireless receiving array 205.

The wireless transmitting array 105 of the printed circuit board 100 wirelessly transmits image data and power to the wireless receiving array 205 of the display panel 200, using the wireless data Wd, and therefore, a partial component (e.g., a flexible printed circuit board) for physically connecting the printed circuit board 100 and the display panel 200 may be omitted. Accordingly, when the display device 1 is manufactured, a process related to the connection of the flexible printed circuit board may be omitted, and the manufacturing process time of the display device 1 can be effectively decreased.

In addition, because the printed circuit board 100 and the display panel 200 are not physically connected, the printed circuit board 100 can be relatively easily separated from the display panel 200 when reworking is performed on the display device 1 so as to recycle a partial component of the display device 1. Accordingly, the time required to perform the reworking can be decreased, damage of the printed circuit board 100 and the display panel 200 can be prevented or reduced in the reworking, and a partial component of the display device 1 can be recycled.

Meanwhile, in an embodiment of the present disclosure, at least one passive element 400 may be located on one surface of the semiconductor device 300. The one surface of the semiconductor device 300 may be an upper surface facing a lower surface of the semiconductor device 300, which is in contact with the display panel 200. The one surface of the semiconductor device 300 may not be in contact with the display panel 200.

The passive element 400 includes a capacitor, an inductor, a resistor, and the like, which have a relatively large capacity. For example, the passive element 400 may include a bypass capacitor, a decoupling capacitor, and the like, which are required when the semiconductor device 300 converts restored image data into a data voltage.

The passive element 400 may be located on the one surface of the semiconductor device 300 through bonding. For example, the passive element 400 may be located on a plurality of second bumps 360 on the one surface of the semiconductor device 300.

As described above, in some example embodiments of the present disclosure, a portion of the passive element 400 having a relatively large capacity is mounted directly one the semiconductor device 300 instead of the printed circuit board 100, so that the spatial limit of the printed circuit board 100 can be minimized. Accordingly, the effective mounting area of the circuit elements 120 can be secured.

The second bumps 360 of the semiconductor device 300 will be described in more detail later with reference to FIGS. 5 to 7.

Figure 3:
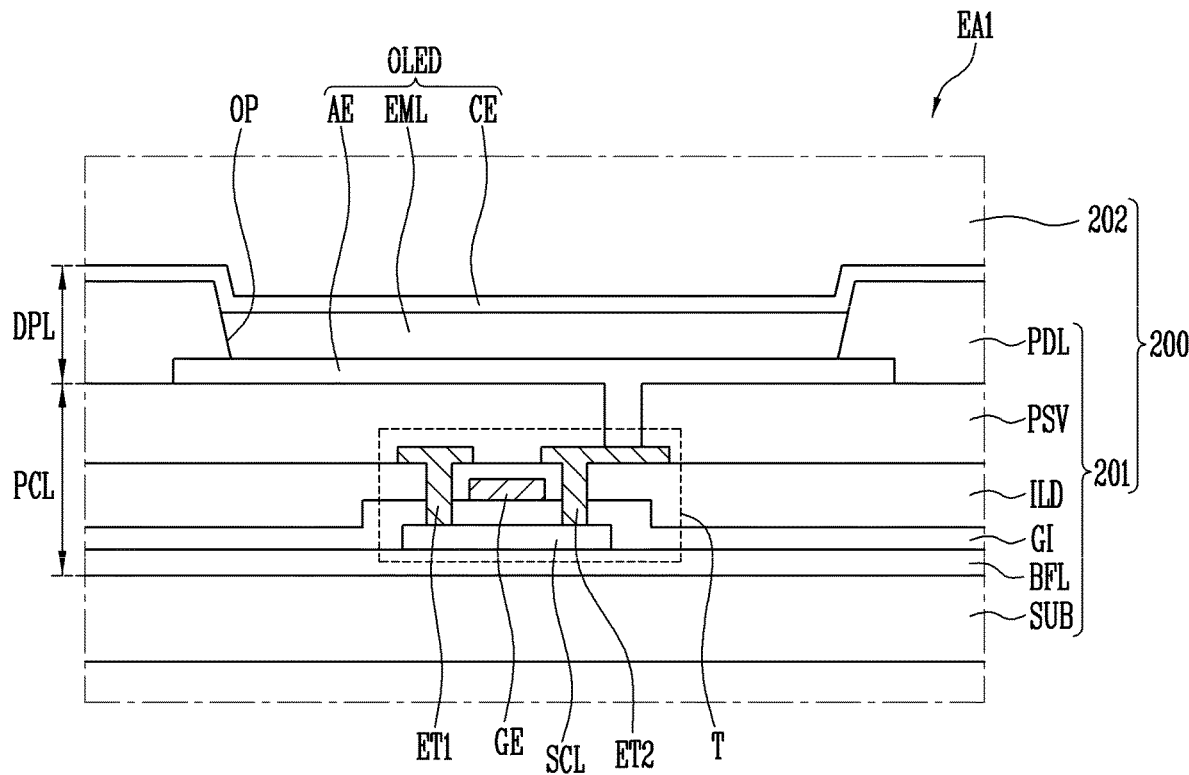
FIG. 3 is an enlarged sectional view of the area EA1 of FIG. 2.

FIG. 3 is an enlarged sectional view of area EA1 of FIG. 2.

Referring to FIGS. 1 to 3, the display panel 200 may include the first substrate 201 and the second substrate 202.

The first substrate 201 may include a substrate SUB, a pixel circuit layer PCL, and a display element layer DPL.

The substrate SUB may be made of an insulative (or insulating) material such as glass or resin. The substrate SUB may be made of a material having flexibility to be bendable or foldable. The substrate SUB may have a single- or multi-layered structure.

For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material constituting the substrate SUB may be variously changed, and the substrate SUB may be made of a Fiber Reinforced Plastic (FRP), etc.

The pixel circuit layer PCL may include a buffer layer BFL located on the substrate SUB and at least one transistor T located on the buffer layer BFL. Although a driving transistor T for driving a light emitting device OLED is exemplarily illustrated in FIG. 3, illustration of another transistor electrically connected to the driving transistor T is omitted.

The buffer layer BFL may prevent an impurity from being diffused into the driving transistor T. The buffer layer BFL may be provided in a single layer, but be provided in a multi-layer including at least two layers. The buffer layer BFL may be omitted according to the material and process conditions of the substrate SUB.

The driving transistor T may include a semiconductor layer SCL, a gate electrode GE, a source electrode ET1, and a drain electrode ET2.

The semiconductor layer SCL may be located on the buffer layer BFL. The semiconductor layer SCL may include a first region and a second region, which are respectively in contact with the source and drain electrodes ET1 and ET2. A region between the first region and the second region may be a channel region. The semiconductor layer SCL may be a semiconductor pattern made of poly-silicon, amorphous silicon, oxide semiconductor, etc. The channel region is a semiconductor pattern undoped with an impurity, and may be an intrinsic semiconductor. Each of the first and second regions may be a semiconductor pattern doped with the impurity. The impurity may include impurities such as an n-type impurity, a p-type impurity, and other metals.

The gate electrode GE may be provided on the semiconductor layer SCL with a gate insulating layer GI interposed therebetween. The gate insulating layer GI may be an inorganic insulating layer including an inorganic material. For example, the gate insulating layer GI may be formed of polysiloxane, silicon nitride, silicon oxide, silicon oxynitride, etc.

The source and drain electrodes ET1 and ET2 may be in contact with the first and second regions of the semiconductor layer SCL through contact holes penetrating an interlayer insulating layer ILD and the gate insulating layer GI, respectively.

The interlayer insulating layer ILD may be an inorganic insulating layer made of an inorganic material or an organic insulating layer made of an organic material.

The pixel circuit layer PCL may include a protective layer PSV arranged over the driving transistor T to cover the driving transistor T. The protective layer PSV may include at least one of an inorganic insulating layer made of an inorganic material or an organic insulating layer made of an organic material. For example, the protective layer PSV may include an inorganic insulating layer and an organic insulating layer on the inorganic insulating layer.

The display element layer DPL may include the light emitting device OLED provided on the protective layer PSV. The light emitting device OLED may include first and second electrodes AE and CE and an emitting layer EML provided between the two electrodes AE and CE. Any one of the first and second electrodes AE and CE may be an anode electrode, and the other of the first and second electrodes AE and CE may be a cathode electrode. For example, the first electrode AE may be the anode electrode, and the second electrode CE may be the cathode electrode. When the light emitting device OLED is a top-emission organic light emitting device, the first electrode AE may be a reflective electrode, and the second electrode CE may be a transmissive electrode. In an embodiment of the present disclosure, a case where the light emitting device OLED is the top-emission organic light emitting device, and the first electrode AE is the anode electrode is described as an example.

The first electrode AE may be electrically connected to the drain electrode ET2 of the driving transistor T through a contact hole penetrating the protective layer. The first electrode AE may include a reflective layer capable of reflecting light and a transparent conductive layer located on the top or bottom of the reflective layer. At least one of the transparent conductive layer and the reflective layer may be electrically connected to the drain electrode ET2.

The display element layer DPL may further include a pixel defining layer PDL having an opening OP for exposing a portion of the first electrode AE, e.g., an upper surface of the first electrode AE. The pixel defining layer PDL may include an organic insulating material.

The emitting layer EML may be located on the exposed surface of the first electrode AE.

The emitting layer EML may include a low-molecular or high-molecular material. In an embodiment of the present disclosure, the low-molecular material may include copper phthalocyanine (CuPc), N,N'-Di(naphthalene-1-yl)-N,N'-diphenyl-benzidine (NPB), tris-8-hydroxyquinoline aluminum (Alq3), and the like. These materials may be formed using a method such as vacuum deposition. The high-molecular material may include poly(3,4-ethylenedioxythiophene (PEDOT)-, poly(phenylene-vinylene) (PPV)-, poly (fluorine)-based materials.

The emitting layer EML may be provided in a single layer, but may also be provided in a multi-layer structure including various functions. When the emitting layer EML is provided in the multi-layer structure, the emitting layer EML may have a structure in which a hole injection layer (HIL), a hole transport layer, an emission layer, an electron transport layer, an electron injection layer, and the like are stacked in a single or complex structure.

However, the emitting layer EML is not limited thereto, and it will be apparent that the emitting layer ELM may have various structures. In addition, at least a portion of the emitting layer EML may be integrally formed throughout a plurality of first electrodes AE, or be individually provided to correspond to each of the plurality of first electrodes AE. The color of light generated from the emitting layer EML may be one of red, green, blue, and white, but this embodiment is not limited thereto. For example, the color of light generated from a light generation layer of the emitting layer EML may be one of magenta, cyan, and yellow.

The second electrode CE may be located on the emitting layer ELM. The second electrode CE may be a semi-transmission reflective layer. For example, the second electrode CE may be a thin metal layer having a thickness enough to enable light emitted from the emitting layer EML to be transmitted therethrough. The second electrode CE may allow a portion of the light emitted from the emitting layer EML, and reflect the rest of the light emitted from the emitting layer EML.

The second substrate 202 may be provided over the light emitting device OLED.

The second substrate 202 may be, for example, a thin encapsulation film formed directly over the light emitting device OLED. When the second substrate 202 is the thin encapsulation film, the second substrate 202 may include a plurality of insulating layers covering the light emitting device OLED. For example, the second substrate 202 may include at least one inorganic layer and at least one organic layer, and have a structure in which the inorganic layers and the organic layers are alternately stacked.

In some embodiments, the second substrate 202 may be an encapsulating substrate that is formed separately from the first substrate 201, and is coupled to the first substrate 201 through a sealing material. When the second substrate 202 is the encapsulating substrate, the second substrate 202 may include a plastic substrate and/or a glass substrate.

Figure 4:
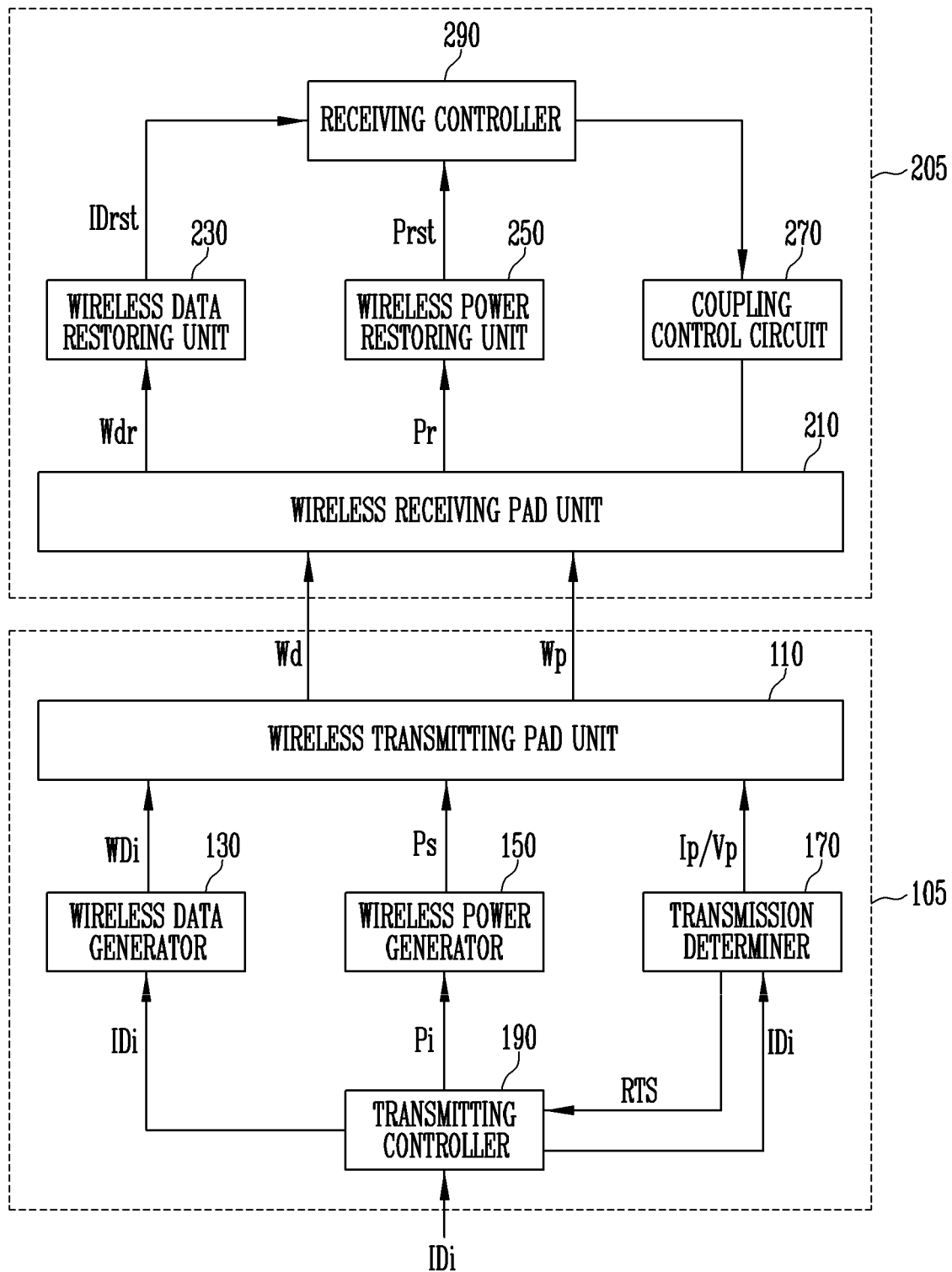
FIG. 4 is a schematic block diagram illustrating a wireless receiving array and a wireless transmitting array, which are shown in FIG. 1.

FIG. 4 is a schematic block diagram illustrating the wireless receiving array and the wireless transmitting array, which are shown in FIG. 1.

Referring to FIGS. 1 to 4, the wireless receiving array 105 may include a wireless transmitting pad unit 110, a wireless data generator 130, a wireless power generator 150, a transmission determiner 170, and a transmitting controller 190.

The transmitting controller 190 may control overall operations of the wireless data generator 130, the wireless power generator 150, and the transmission determiner 170. The transmitting controller 190 may receive input image data IDi, and transfer the input image data IDi to the wireless data generator 130. Also, the transmitting controller 190 may output input power Pi. The transmitting controller 190 may directly generate the input power Pi or receive the input power Pi, and transfer the input power Pi to the power generator 150.

The wireless data generator 130 may receive the input image data IDi, and convert the input image data IDi into a transmission signal WDi such that the input image data IDi can be wirelessly transmitted through the wireless transmitting pad unit 110.

The wireless power generator 150 may receive the input power Pi, and convert the input power Pi into transmission power Ps such that the input power Pi can be wirelessly transmitted through the wireless transmitting pad unit 110.

The wireless transmitting pad unit 110 may serve as an antenna for transferring data or power. The wireless transmitting pad unit 110 may receive the data transmission signal WDi, and wirelessly transmit the data transmission signal WDi as wireless data Wd. Also, wireless transmitting pad unit 110 may receive the transmission power Ps, and wirelessly transmit the transmission power Ps as wireless power Wp.

For example, the wireless transmitting pad unit 110 may include a coil for forming a pad current Ip or an electrode for forming a pad voltage Vp so as to wirelessly transmit data or power at a short distance.

The transmission determiner 170 may determine whether the wireless data Wd and/or the wireless power Wp has been effectively transmitted, and transfer the determination result to the transmitting controller 190. The transmission determiner 170 may sense a pad current flowing through the wireless transmitting pad unit 110 or a pad voltage Vp applied to the wireless transmitting pad unit 110, and determine whether the wireless data Wd and/or the wireless power Wp has been effectively wirelessly transmitted, based on the pad current Ip or the pad voltage Vp.

When the transmission determiner 170 does not determine that the wireless data Wd has been effectively transmitted, the transmission determiner 170 may output a retransmission signal RTS to the transmitting controller 190 such that the wireless transmitting pad unit 110 can retransmit the wireless data Wd.

The wireless receiving array 205 may include a wireless receiving pad unit 210, a wireless data restoring unit 230, a wireless power restoring unit 250, a coupling control circuit 270, and a receiving controller 290.

The wireless receiving pad unit 210 may serve as an antenna for transferring data or power. The wireless receiving pad unit 210 is coupled to the wireless transmitting pad unit 110 through a magnetic field, an electric field, and/or an electromagnetic field, which may mean that an electrical signal, data or power is wirelessly received and transmitted.

The wireless receiving pad unit 210 may wirelessly receive wireless the data Wd and the wireless power Wp, and output reception power Pr in response to the wireless data Wd. For example, the wireless receiving pad unit 210 may include a coil or electrode corresponding to the wireless transmitting pad unit 110 so as to wirelessly receive data or power at a short distance.

The wireless data restoring unit 230 may receive a data reception signal Wdr, and generate restored image data IDrst from the data reception signal Wdr, so that the input image data IDi is restored. The restored image data IDrst may have a form that can be processed in the receiving controller 290 or the semiconductor device 300, and have a high logic level or low logic level corresponding to the data reception signal Wdr. The wireless data restoring unit 230 may output the restored image data IDrst to the receiving controller 290.

The wireless power restoring unit 250 may receive the reception power Pr, and generate restored power Prst. The restored power Prst may have a form that can be used in the receiving controller 290 or the semiconductor device 300, and be DC power. The wireless power restoring unit 250 may include an AC-DC converter and a DC-DC converter.

The coupling control circuit 270 may control a resonant frequency of the wireless receiving pad unit 210.

The receiving controller 290 may control overall operations of the wireless data restoring unit 230, the wireless power restoring unit 250, and the coupling control circuit 270. The receiving controller 290 may receive the restored image data IDrst and the restored power Prst, and transfer the restored image data IDrst and the restored power Prst to the semiconductor device 300.

Figure 5:
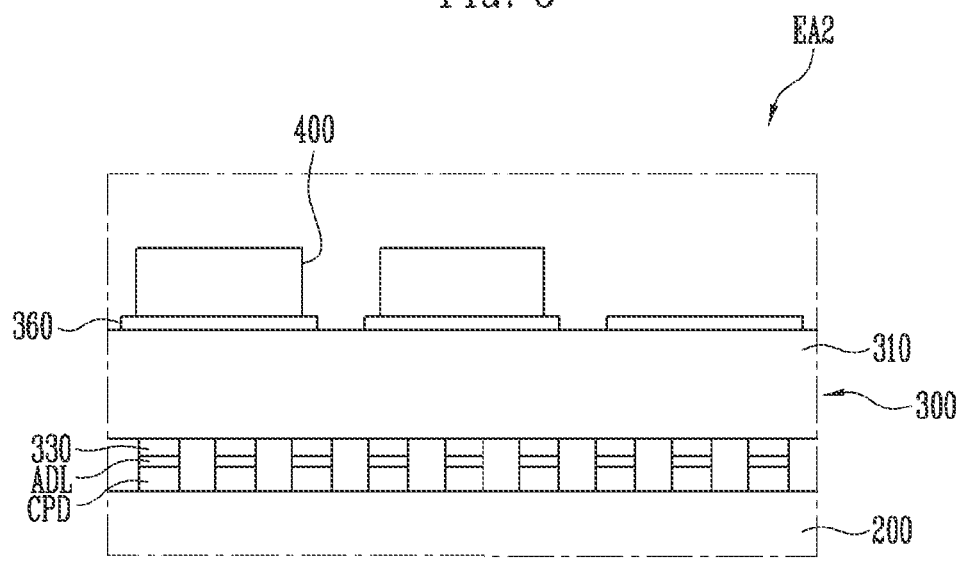
FIG. 5 is an enlarged sectional view of the area EA2 of FIG. 2.

FIG. 5 is an enlarged sectional view of area EA2 of FIG. 2.

Referring to FIGS. 1 to 5, the semiconductor device 300 may be mounted in the non-display area NDA of the display panel 200 through a bonding process.

A plurality of connection pads CPD may be provided in the non-display area NDA of the display panel 200. The connection pads CPD may be made of a conductive material such as aluminum (Al). The connection pads CPD may be electrically connected to the semiconductor device 300 to transfer various powers and/or signals, supplied from the semiconductor device 300 to the pixels PXL of the display panel 200.

The semiconductor device 300 may include a semiconductor chip 310, a plurality of first bumps 330 located on one surface of the semiconductor chip 310, and a plurality of second bumps 360 provided on the other surface of the semiconductor chip 310.

The semiconductor chip 310 may be provided in a form in which a semiconductor substrate having an electronic circuit integrated therein is cut and machined in a die shape. Also, the semiconductor chip 310 may be provided in a form in which a semiconductor die having an electronic circuit integrated therein is packaged on a package substrate or in which a plurality of semiconductor dies are stacked through vias formed using a Through Silicon Via (TSV) technique. The semiconductor chip 310 may be a memory chip in which a memory IC such as a DRAM, an SRAM, a flash, an MRAM, RERAM, an FeRAM or a PcRAM is integrated or a logic chip in which a logic IC is integrated, but the present disclosure is not limited thereto. In an embodiment of the present disclosure, the semiconductor chip 310 may be a data driver IC for transferring a data signal to the pixels PXL of the display panel 200.

The first bumps 330 may be located on the one surface of the semiconductor chip 310, and each of the first bumps 330 may be spaced apart from one adjacent first bump 330 at a certain distance. The first bumps 330 may be a metal bump. Although an embodiment in which the first bumps 330 are regularly arranged on the one surface of the semiconductor chip 310 is illustrated in FIG. 5, the present disclosure is not limited thereto. That is, the sizes (e.g., the length, width, and height) of the first bumps 330, the number of the first bumps 330, the arrangement structure of the first bumps 330, and/or the distance between the adjacent first bumps 330 may be variously modified. In some example embodiments, the first bumps 330 may be arranged in a zigzag pattern on the one surface of the semiconductor chip 310.

The first bumps 330 may be located on the one surface of the semiconductor chip 310 to be opposite to the connection pads CPD of the display panel 200, to be electrically connected to the connection pads CPD. That is, each of the first bumps 330 may be located on the one surface of the semiconductor chip 310 to be opposite to one corresponding connection pad CPD among the connection pads CPD, to be electrically connected to the one corresponding connection pad CPD. The first bumps 330 may be made of a conductive material such gold (Au).

In some embodiments, an adhesive layer ADL may be located between the connection pads CPD and the first bumps 330. The adhesive layer ADL may include a non-conductive adhesive material, and allow the display panel 200 and the semiconductor device 300 to be stably joined between the connection pads CPD and the first bumps 330 when the display panel 200 and the semiconductor device 300 are bonded to each other.

In some embodiments, the adhesive layer ADL may include a conductive adhesive material configured by mixing the conductive material constituting the connection pads CPD and the conductive material constituting the first bumps 330. The adhesive layer ADL may be a solid-state junction layer obtained by melting surfaces of the first bumps 330 and the connection pads CPD through friction between the first bumps 330 and the connection pads CPD when the semiconductor device 300 is connected to the display panel 200 and then hardening the melted surfaces.

The second bumps 360 may be located on the other surface of the semiconductor chip 310, on which the first bumps 330 are not provided, and each of the second bumps 360 may be spaced apart from one adjacent second bump 360 at a certain distance. In some embodiments, the second bumps 360 may be metal bumps, and include the same material as the first bumps 330. However, the present disclosure is not limited thereto. In some embodiments, the second bumps 360 may be solder bumps.

Although an embodiment in which the second bumps 360 are regularly arranged on the other surface of the semiconductor chip 310 is illustrated in FIG. 5, the present disclosure is not limited thereto. That is, the sizes (e.g., the length, width, and height) of the second bumps 360, the number of the second bumps 360, the arrangement structure of the second bumps 360, and/or the distance between the adjacent second bumps 360 may be variously modified.

In an embodiment of the present disclosure, the second bumps 360 and the first bumps 330 may have different sizes. In an example, the size of the second bumps 360 may be larger than that of the first bumps 330. This is because the passive element 400 having a relatively large capacity is mounted on the second bumps 360. The method of mounting the passive element 400 on the second bumps 360 may be performed using various techniques. In an example, reflow soldering, flow soldering, etc., may be applied. However, the present disclosure is not limited thereto, and various techniques for electrically connecting the second bumps 360 and the passive element 400 may be applied.

Some of the second bumps 360 may be connected to some of the first bumps 330 through a through hole penetrating the semiconductor chip 310. The through hole may be formed using a Through Silicon Via (TSV) technique for electrically connecting adjacent semiconductor chips or circuit elements by penetrating the semiconductor chip 310 configured with a plurality of layers, using a silicon via.

In some example embodiments of the present disclosure, the first bumps 330 may be configured to provide an electrical connection part between the semiconductor device 300 and an external device (e.g., the display panel 200). In addition, the second bumps 360 may be configured to provide an electrical connection part between the semiconductor device 300 and an external device, e.g., the passive element 400.

Figure 6:
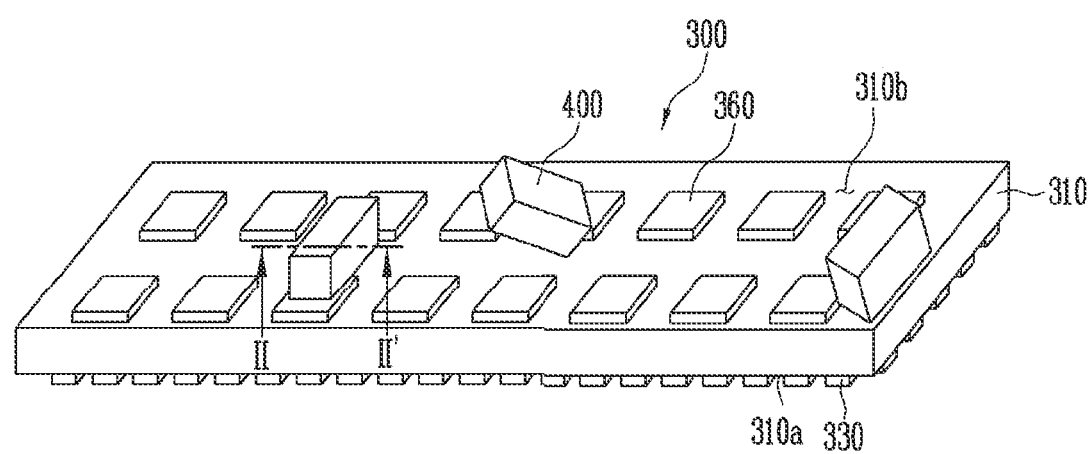
FIG. 6 is a perspective view illustrating a semiconductor device and a passive element according to some example embodiments of the present disclosure.
Figure 6:
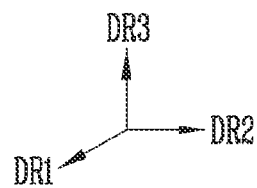

FIG. 6 is a perspective view illustrating a semiconductor device and a passive element according to an embodiment of the present disclosure. FIG. 7 is a sectional view taken along line II-II' of FIG. 6.

Figure 7:
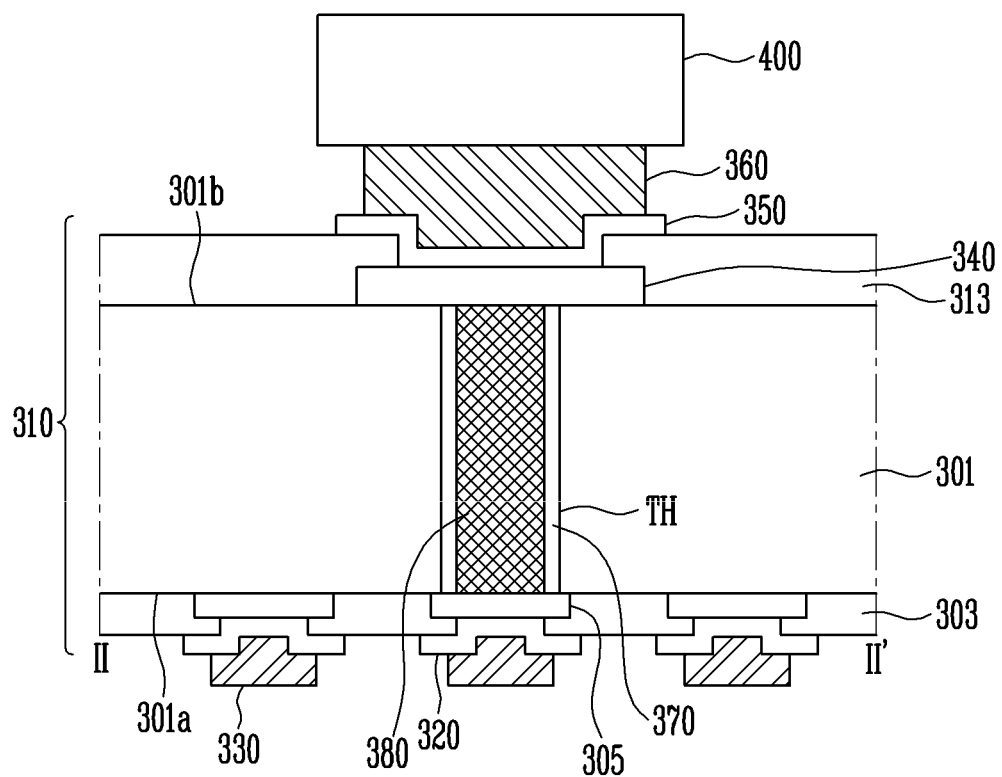
FIG. 7 is a sectional view taken along the line II-II' of FIG. 6.
Figure 8A:
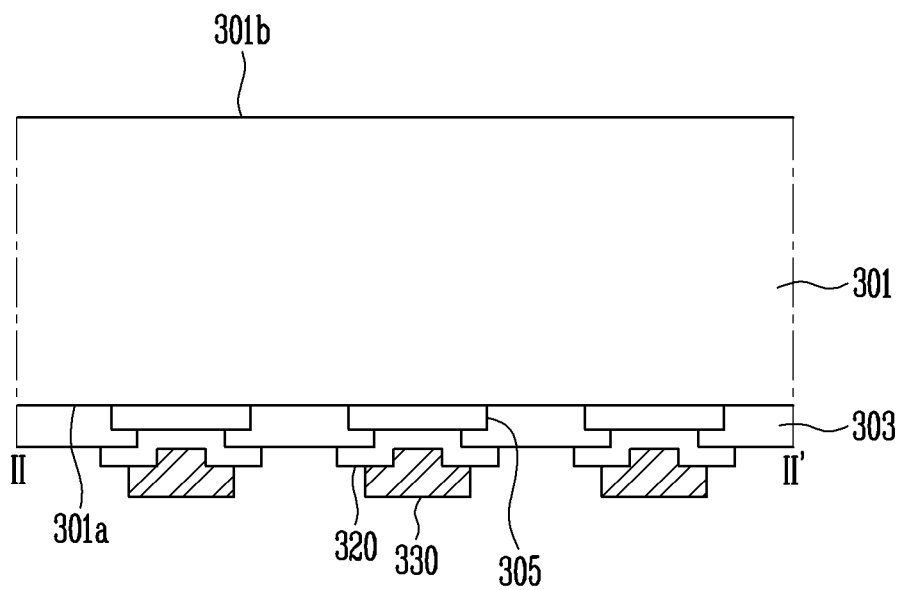
FIGS. 8A to 8H are sectional views sequentially illustrating a method of forming second bumps on a second surface of the semiconductor device of FIG. 7.
Figure 8B:
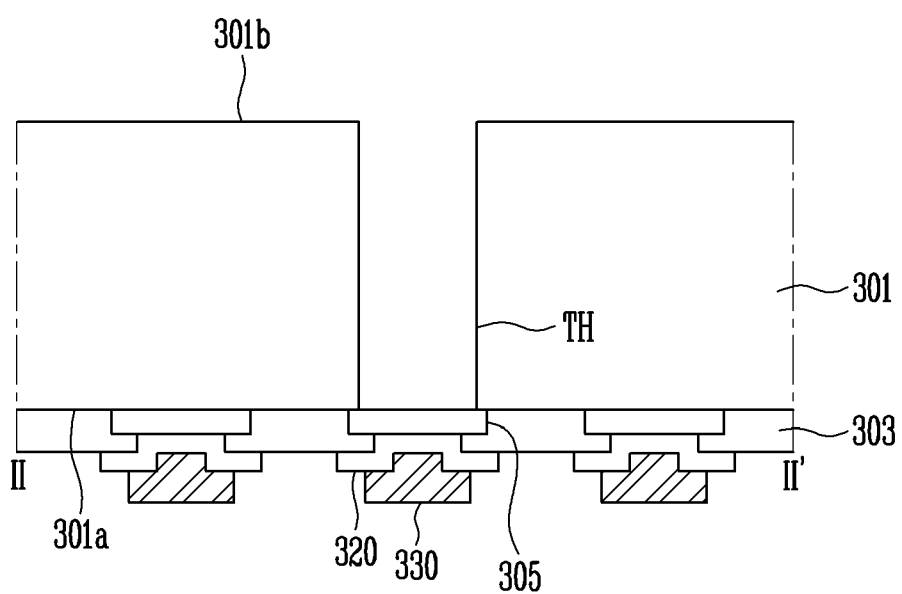
Figure 8C:
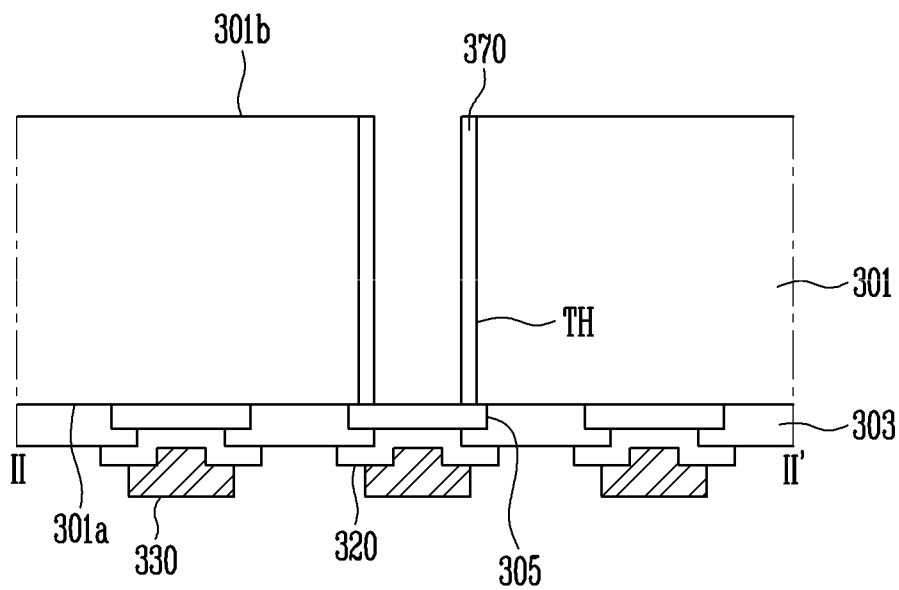
Figure 8D:
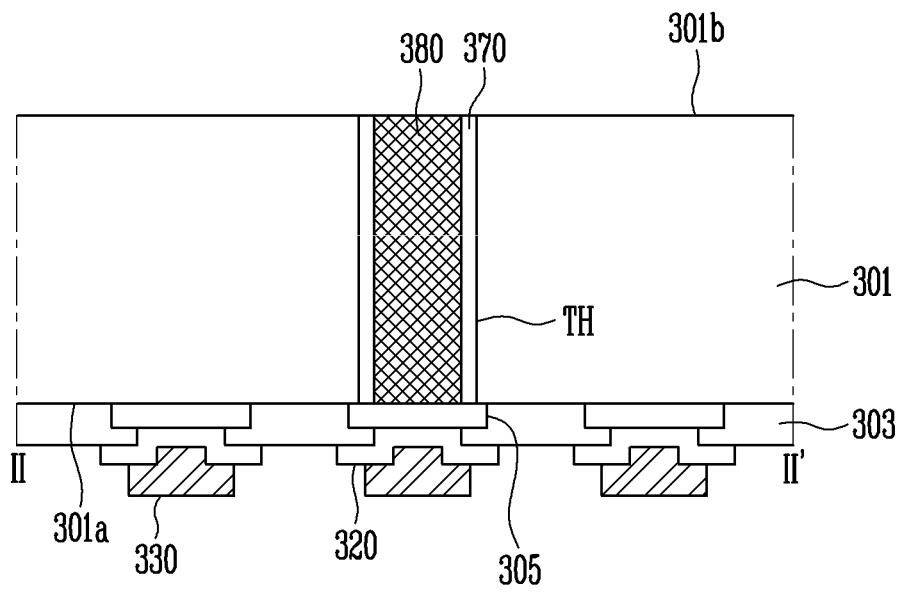
Figure 8E:
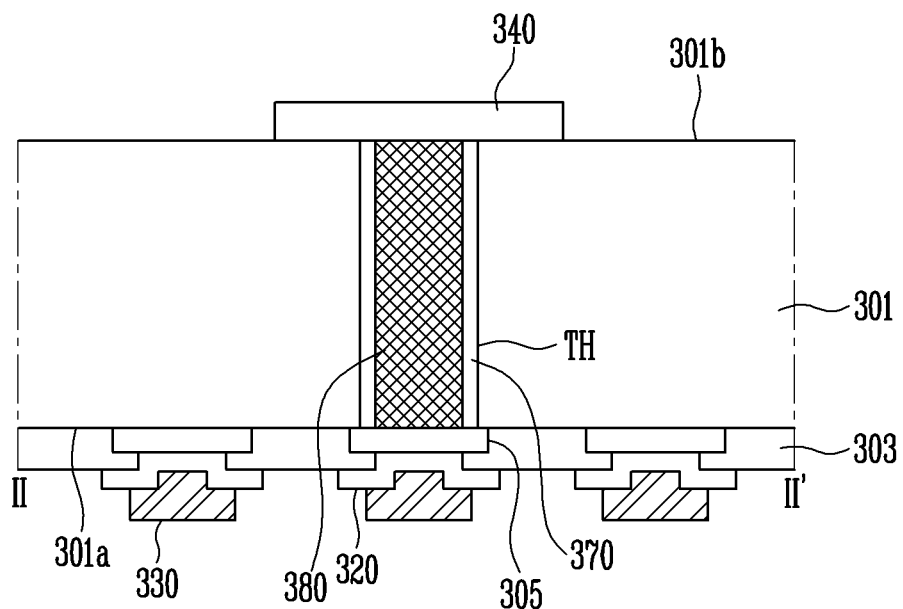
Figure 8F:
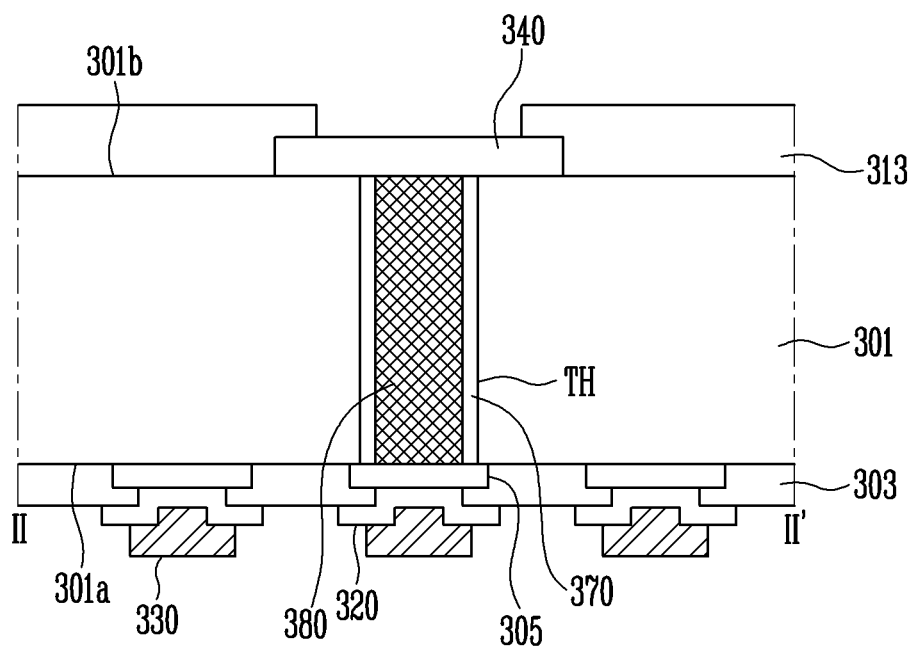
Figure 8G:
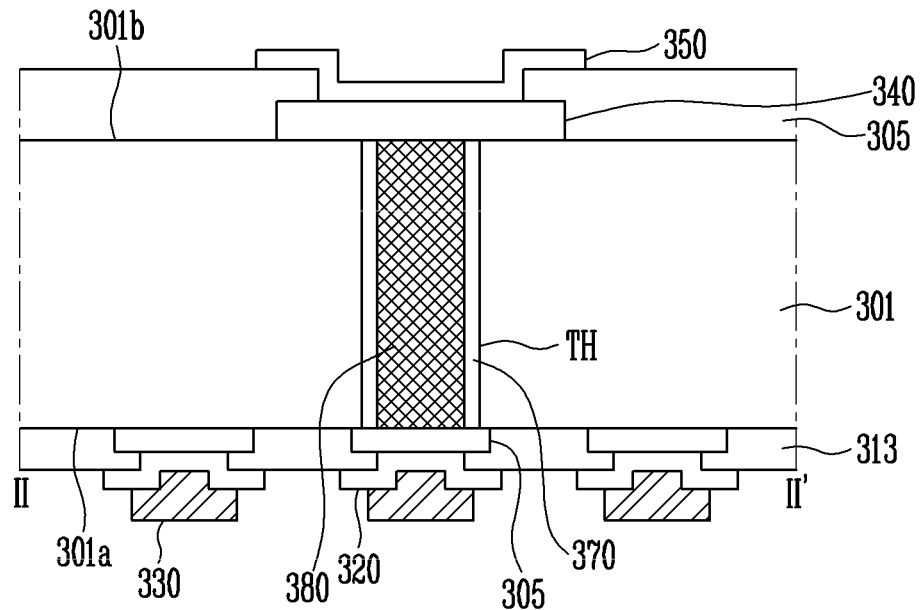
Figure 8H:
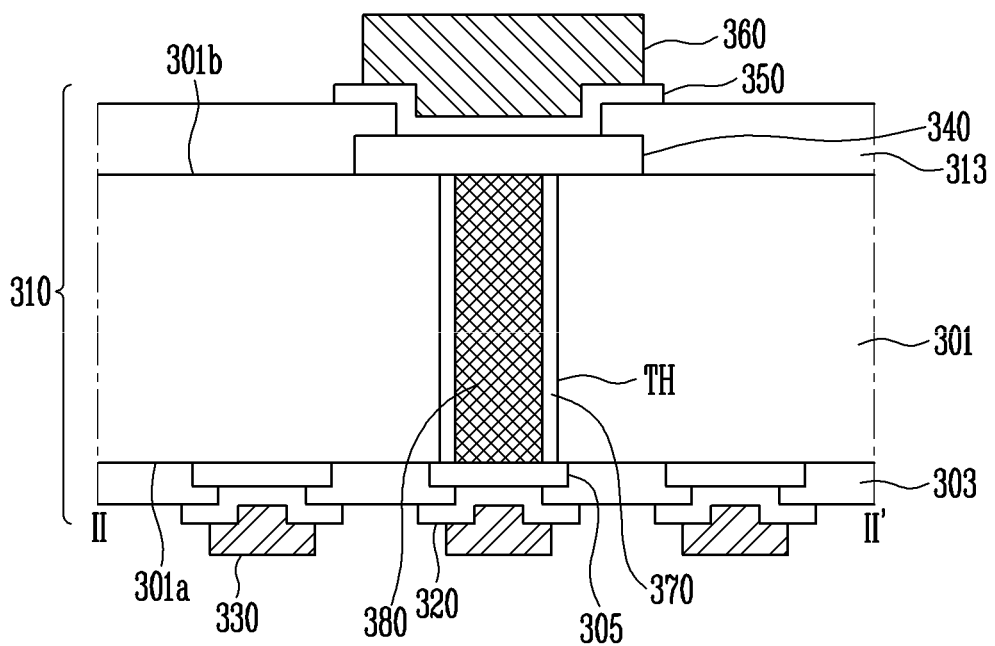

In FIGS. 6 and 7, only some components among components constituting a semiconductor chip are schematically illustrated for convenience.

Referring to FIGS. 1 to 7, the semiconductor device 300 according to some example embodiments of the present disclosure may include a semiconductor chip 310, a plurality of first bumps 330 located on one surface 310a (hereinafter, referred to as a 'lower surface') of the semiconductor chip 310, and a plurality of second bumps 360 located on the other surface 310b (hereinafter, referred to an 'upper surface') of the semiconductor chip 310.

The semiconductor chip 310 may include a semiconductor substrate 301, at least one first conductive pad 305 located on a first surface 301a of the semiconductor substrate 301, a first insulating layer 303 located in at least one region on the first conductive pad 305, and a first conductive medium layer 320.

The semiconductor substrate 301 may be, for example, a semiconductor substrate made of a silicon material. The semiconductor substrate 301 may be used to implement the semiconductor chip 310 through a semiconductor manufacturing process such as a CMOS process. In an embodiment of the present disclosure, the semiconductor substrate 301 is not limited thereto, and the material and shape of the semiconductor substrate 301 may be modified. In some embodiments, various circuit elements and/or lines may be embedded in the semiconductor substrate 301.

In some embodiments, the first conductive medium layer 320 and the first bump 330 may be located on one surface (e.g., a lower surface) of a first conductive pad 305 corresponding thereto to overlap with the first conductive pad 305. In some embodiments, the first conductive medium layer 320 and one first bump 330 may be electrically connected to the first conductive pad 305 through one region of the conductive pad 305, which is not covered by the first insulating layer 303.

The first conductive pad 305 may include at least one conductive layer (e.g., at least one metal layer). Meanwhile, the material of the first conductive pad 305 is not necessarily limited to metal, and may be modified. For example, the first conductive pad 305 may include at least one of a metal, an alloy thereof, a conductive polymer, and a conductive metal oxide.

In some embodiments, examples of a metal capable of constituting the first conductive pad 305 may be copper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), Osmium (Os), manganese (Mn), molybdenum (Mo), tungsten (W), niobium (Nb), tantalum (Ta), titanium (Ti), bismuth (Bi), antimony (Sb), lead (Pb), and the like. In some embodiments, examples of a conductive polymer capable of constituting the first conductive pad 305 may be polythiophene-based, polypyrrole-based, polyaniline-based, polyacetylene-based, and polyphenylene-based compounds, mixtures thereof, and the like. For example, a PEDOT/PSS compound among the polythiophene-based compounds may be used as the conductive polymer capable of constituting the first conductive pad 305. In some embodiments, examples of a conductive metal oxide capable of constituting the first conductive pad 305 may be Indium Tin Oxide (ITO), Indium Zinc Oxide (IZO), Antimony Zinc Oxide (AZO), Indium Tin Zinc Oxide (ITZO), Zinc Oxide (ZnO), Tin Oxide ($SnO_2$), and the like. In addition, a material capable of providing conductivity as well as the above-described conductive materials may be used as the material constituting the first conductive pad 305.

In some example embodiments, the area of a region in which the first conductive pad 305 may be larger than that of a region in which the first conductive medium layer 320 and one first bump 330 corresponding thereto are formed, but the present disclosure is not limited thereto. However, the first conductive pad 305 is covered by the first insulating layer 303, the first conductive medium layer 320, and/or one first bump 330 corresponding thereto. Accordingly, the first conductive pad 305 is not exposed to the outside.

The first insulating layer 303 may be provided over one region of the first conductive pad 305. The first insulating layer 303 may have an opening for exposing at least one region (e.g., a bonding region or contact region) of the first conductive pad 305. For example, the first insulating layer 303 may be patterned to cover only an edge region of the first conductive pad 305 while exposing a central portion of the first conductive pad 305. That is, the first insulating layer 303 is located on the lower surface 301a of the semiconductor substrate 301, on which the first conductive pad 305 is located, and may have an opening for exposing one region (e.g., a central region) of the first conductive pad 305. The first insulating layer 303 may serve as a passivation layer for protecting the first surface 301a of the semiconductor substrate 301.

In some embodiments, the first insulating layer 303 may include at least one oxide layer or at least one nitride layer, but the present disclosure is not limited thereto. For example, the first insulating layer 303 may be configured with a silicon nitride layer ($SiN_xO$) and/or a silicon oxide layer ($SiO_x$).

The first conductive medium layer 320 may be provided on the bottom of the first conductive pad 305 exposed by the first insulating layer 303. In some embodiments, the first conductive medium layer 320 may be implemented with at least one metal layer. For example, the first conductive medium layer 320 may be implemented with at least one metal layer including at least one of copper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), Osmium (Os), manganese (Mn), molybdenum (Mo), tungsten (W), niobium (Nb), tantalum (Ta), titanium (Ti), bismuth (Bi), antimony (Sb), lead (Pb), and alloys thereof. The first conductive medium layer 320 is provided as a seed layer of the semiconductor chip 310, to electrically connect the first conductive pad 305 and a first bump 330 corresponding thereto.

In some embodiments, the first bump 330 may be provided on the bottom of the first conductive medium layer 320. In some embodiments, the first bump 330 along with the first conductive medium layer 320 is located on the top of the one region of the first conductive pad 305, which is exposed by the opening of the first insulating layer 303, and the top of the first insulating layer 303 around the opening.

The first bump 330 may have a surface having an uneven structure along the profile of the first insulating layer 303. As shown in FIG. 7, a protrusion part corresponding to the opening of the first insulating layer 303 may be formed at a surface (e.g., a surface in contact with the first conductive medium layer 320) of the first bump 330. In some embodiments, the depth of the protrusion part may be similar or substantially equal to the height (or thickness) of the first insulating layer 303.

In some embodiments, the first bump 330 may be implemented with at least one metal layer. For example, the first bump 330 may be implemented with at least one metal layer including at least one of copper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), Osmium (Os), manganese (Mn), molybdenum (Mo), tungsten (W), niobium (Nb), tantalum (Ta), titanium (Ti), bismuth (Bi), antimony (Sb), lead (Pb), and alloys thereof. The first bump 330 is connected to the connection pad CPD of the display panel 200, to electrically connect the semiconductor device 300 and the display device 200.

The first bump 330 may include first input bumps and first output bumps on at least one row, which are located on the first surface 301a of the semiconductor substrate 301. The first input bumps and the first output bumps may be arranged to be spaced apart from each other at a certain distance or more.

In some example embodiments of the present disclosure, the semiconductor chip 310 may further include at least one second conductive pad 340 located on a second surface 301b of the semiconductor substrate 301, a second insulating layer 313 located in at least one region on the second conductive pad 340, and a second conductive medium layer 350. A second bump 360 may be located on the second conductive medium layer 350.

In some example embodiments, the second conductive medium layer 350 and the second bump 360 may be located on one surface (e.g., an upper surface) of a second conductive pad 340 corresponding thereto to overlap with the second conductive pad 340. In some embodiments, the second conductive medium layer 350 and the second bump 360 may be electrically connected to the second conductive pad 340 through one region of the second conductive pad 340, which is not covered by the second insulating layer 313.

The second conductive pad 340 may include at least one conductive layer (e.g., at least one metal layer). The second conductive pad 340 may be made of the same material as the first conductive pad 305, but the present disclosure is not limited thereto.

The area of a region in which the second conductive pad 340 is formed may be larger than that of a region in which the second conductive medium layer 350 and the second bump 360 corresponding thereto are formed, but the present disclosure is not limited thereto. However, the second conductive pad 340 is covered by the second insulating layer 313, the second conductive medium layer 350, and/or one second bump 360 corresponding thereto. Accordingly, the second conductive pad 340 is not exposed to the outside.

In some example embodiments of the present disclosure, the second conductive pad 340 may have a size larger than that of the first conductive pad 305. For example, the size of the second conductive pad 340 may be equal to or larger than that of the second bump 360 corresponding thereto.

The second insulating layer 313 may be provided over one region of the second conductive pad 340. The second insulating layer 313 may have an opening for exposing at least one region (e.g., a bonding region or contact region) of the second conductive pad 340. For example, the second insulating layer 313 may be patterned to cover only an edge region of the second conductive pad 340 while exposing a central portion of the second conductive pad 340. The second insulating layer 313 may serve as a passivation layer for protecting the second surface 301b of the semiconductor substrate 301.

In some embodiments, the second insulating layer 313 may be configured with at least one inorganic insulating layer including an inorganic material. In an embodiment of the present disclosure, the second insulating layer 313 may include the same material as the first insulating layer 303.

The second conductive medium layer 350 may be provided on the top of the second conductive pad 340 exposed by the second insulating layer 313. The second conductive medium layer 350 may be implemented with at least one metal layer. In an embodiment of the present disclosure, the second conductive medium layer 350 ma include the same material as the first conductive medium layer 320.

A second bump 360 corresponding to the second conductive medium layer 350 may be provided on the top of the second conductive medium layer 350. In some embodiments, the second bump 360 along with the second conductive medium layer 350 is located on the top of the one region of the second conductive pad 350, which is exposed by an opening of the second insulating layer 313, and the top of the second insulating layer 313 around the opening.

The second bump 360 may have a surface having an uneven structure along the profile of the second insulating layer 313. As shown in FIG. 7, a protrusion part corresponding to the opening of the second insulating layer 313 may be formed at a surface (e.g., a surface in contact with the second conductive medium layer 350) of the second bump 360. In some embodiments, the depth of the protrusion part may be similar or substantially equal to the height (or thickness) of the second insulating layer 313. The second bump 360 may include second input bumps and second output bumps on at least one row, which are located on the second surface 301b of the semiconductor substrate 301. The second input bumps and the second output bumps may be arranged to be spaced apart from each other at a certain distance or more.

In some example embodiments of the present disclosure, because the passive element 400 having a relatively large capacity is mounted on the second bump 360, the second bump 360 may have a size larger than that of the first bump 330 so as to sufficiently secure a contact area between the second bump 360 and the passive element 400. The size of the second bump 360 may be similar or substantially equal to that of the passive element 400.

The passive element 400 may include at least one bonding pad located on a surface facing the second bump 360. The bonding pad of the passive element 400 may be in contact with the second bump 360, to electrically connect the semiconductor chip 310 and the passive element 400. In an embodiment of the present disclosure, the second bump 360 may be a solder bump.

In an embodiment of the present disclosure, the number of first bumps 330 formed on the lower surface 310a of the semiconductor chip 310 may be different from that of second bumps 360 located on the upper surface 310b of the semiconductor chip 310. When the lower surface 310a and the upper surface 310b of the semiconductor chip 310 have the same area, the second bumps 360 having a size larger than that of the first bumps 310 may be located on the upper surface 310b of the semiconductor chip 310 such that the number of the second bumps 360 is smaller than that of the first bumps 330.

Meanwhile, in an embodiment of the present disclosure, the semiconductor chip 310 may include at least one through hole TH penetrating the semiconductor substrate 301. A connection electrode 380 buried with a conductive material in the through hole TH may be provided in the through hole TH. An insulating film 370 for blocking direct electrical connection between the connection electrode 380 and the semiconductor substrate 301 may be formed on an inner surface of the through hole TH.

The insulating film 370 may completely cover the inner surface of the through hole TH, to prevent or reduce instances of an unwanted short circuit that may occur between the connection electrode 380 and the semiconductor substrate 301. The insulating film 370 may include at least one insulating material selected from the group consisting of $SiO_2$, $Si_3N_4$, $Al_2O_3$, and $TiO_2$. However, the present disclosure is not limited thereto, and various material having insulating properties may be used.

In an embodiment of the present disclosure, the through hole TH may be formed in the semiconductor substrate 301, using a Through Silicon Via (TSV) technique. The connection electrode 380 may be formed of a conductive material, and may be located between at least one first conductive pad 305 on the first surface 301a of the semiconductor substrate 301 and at least one second conductive pattern 340 on the second surface 301b of the semiconductor substrate 301, to electrically connect the first conductive pad 305 and the second conductive pad 340.

As described above, the first conductive pad 305 and the second conductive pad 340 are electrically connected through the connection electrode 380 in the through hole TH, so that the first bump 330 located on the first conductive pad 305 and the second bump 360 located on the second conductive pad 340 can be electrically connected to each other. Accordingly, the passive element 400 arranged and/or mounted on the second bump 360 is electrically connected to the first bump 330, and a portion of the wireless power Wp received from the wireless transmitting pad unit 190 to the semiconductor device 300 is transferred to the passive element 400 through the first bump 330, the connection electrode 380, and the second bump 360.

In an embodiment of the present disclosure, the passive element 400 includes a capacitor, an inductor, a resistor, and the like, which have a relatively large capacity. For example, the passive element 400 may include a bypass capacitor, a decoupling capacitor, and the like, which are required when the semiconductor device 300 converts restored image data into a data voltage.

As described above, in the embodiment of the present disclosure, a portion of the passive element 400 having a relatively large capacity is located and/or mounted directly on the second bump 360 of the semiconductor chip 310 instead of the printed circuit board 100, so that the spatial limit of the printed circuit board 100 can be minimized. Accordingly, the effective mounting area of at least one circuit elements 120 mounted on the printed circuit board 100 can be sufficiently secured.

FIGS. 8A to 8H are sectional views sequentially illustrating a method of forming second bumps on the second surface of the semiconductor device of FIG. 7.

Referring to FIGS. 1 to 8A, a first conductive pad 305, a first insulating layer 303, a first conductive medium layer 320, and at least one first bump 330 are formed on the first surface 301a of the semiconductor substrate 301.

In some example embodiments of the present disclosure, the semiconductor substrate 301 may be a wafer substrate in which an electronic circuit and the like are integrated, and the first surface 301a of the semiconductor substrate 301 may be a surface bonded and/or in contact with the display panel 200. The first bump 330 may be electrically connected to a corresponding first conductive pad 305 through the first conductive medium layer 320.

Referring to FIGS. 1 to 8B, a through hole TH penetrating the semiconductor substrate 301 is formed. The through hole TH may be formed using a Through Silicon Via (TSV) package technique. The TSV package technique refers to a technique for electrically connecting some components located on the first surface 301a of the semiconductor substrate 301 and some components located on the second surface 301b of the semiconductor substrate 301 by vertically boring a hole in the semiconductor substrate 301 from the second surface 301b of the semiconductor substrate 301. In some example embodiments of the present disclosure, the through hole TH may expose, to the outside, a portion of the first conductive pad 305 located on the first surface 301a of the semiconductor substrate 301.

Referring to FIGS. 1 to 8C, an insulating film 370 made of an insulative (or insulating) material is formed on an inner surface of the through hole TH. The insulating film 370 may function to minimize or reduce direct electrical connection between a connection electrode 380 which will be formed through a subsequent process and the semiconductor substrate 301.

Referring to FIGS. 1 to 8D, a connection electrode 380 made of a conductive material is formed in the through hole TH. The conductive material may include copper, aluminum, tungsten or a similar material. In some embodiments, the connection electrode 380 may be formed through a deposition process. In other embodiments, the connection electrode 380 may be formed through a plating process (e.g., an electroplating process or electroless plating process). The connection electrode 380 may fill in the through hole TH, and include one surface having the same plane as the second surface 301b of the semiconductor substrate 301.

In some example embodiments of the present disclosure, the connection electrode 380 may extend up to the first surface 301a of the semiconductor substrate 301 to be physical and/or electrically connected to the first conductive pad 305 exposed to the outside.

Referring to FIGS. 1 to 8E, a second conductive pad 340 is formed on the second surface 301b of the semiconductor substrate 301. The second conductive pad 340 may be formed of the same material as the first conductive pad 305. In some example embodiments of the present disclosure, the second conductive pad 340 may be in direct contact with the connection electrode 380 to be electrically connected to the first conductive pad 305.

Referring to FIGS. 1 to 8F, a second insulating layer 313 including an opening for exposing a portion of the second conductive pad 340 is formed by forming an insulating material layer on the second conductive pad 340 and then patterning the insulating material layer through a process using a mask.

Referring to FIGS. 1 to 8G, a second conductive medium layer 350 is formed on the second insulating layer 313. The second conductive medium layer 350 may be physically and/or electrically connected to the second conductive pad 340 through the opening of the second insulating layer 313.

The second conductive medium layer 350 may be formed of the same material as the first conductive medium 320. The second conductive medium layer 350 is a seed layer of the semiconductor chip 310, and may serve as a connection part for more stably connecting between the second conductive pad 340 and a second bump 360 to be formed through a subsequent process.

Referring to FIGS. 1 to 8H, the second bump 360 is formed on the second conductive medium layer 350. In some example embodiments, the second bump 360 may include a solder bump, a copper bump, a metal bump including nickel (Ni) or gold (Au), or a combination thereof.

The second bump 360 may be in direct contact with the second conductive medium layer 350 to be physically and/or electrically connected to the second conductive medium layer 350. Accordingly, the second bump 360 can be electrically connected to the second conductive pad 340. Also, the second bump 360 can be electrically connected to the first bump 330 through the connection electrode 380 in the through hole TH.

Figure 9:
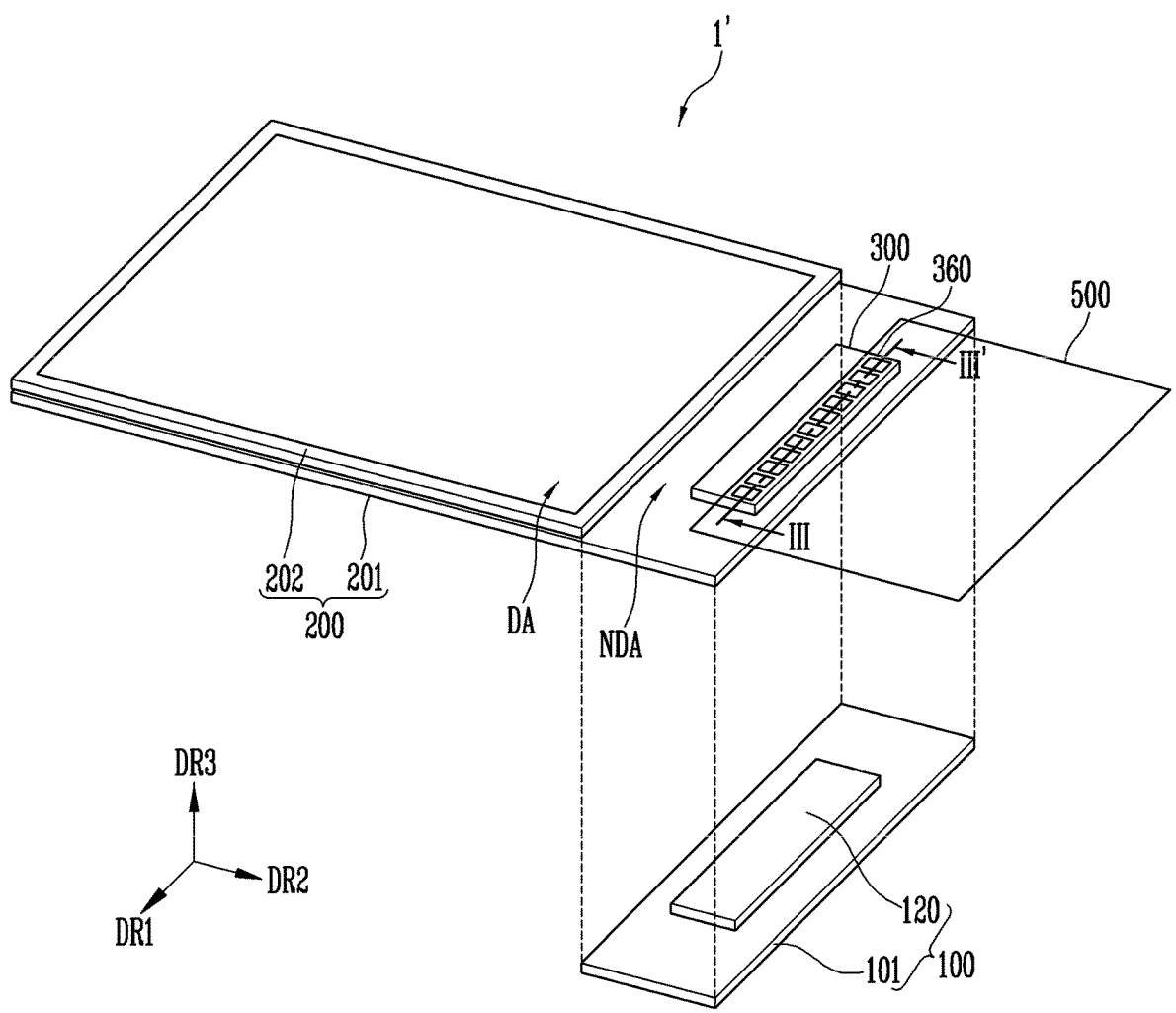
FIG. 9 is a schematic perspective view of a display device according to another embodiment of the present disclosure.
Figure 10:
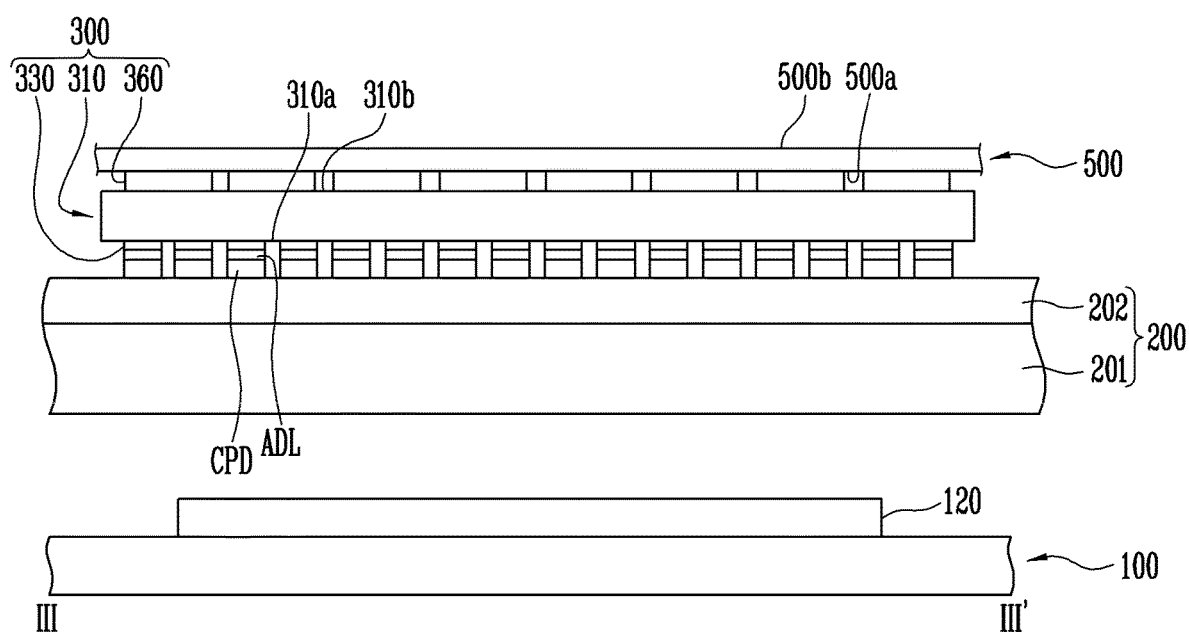
FIG. 10 is a sectional view taken along the line III-III' of FIG. 9.
Figure 11:
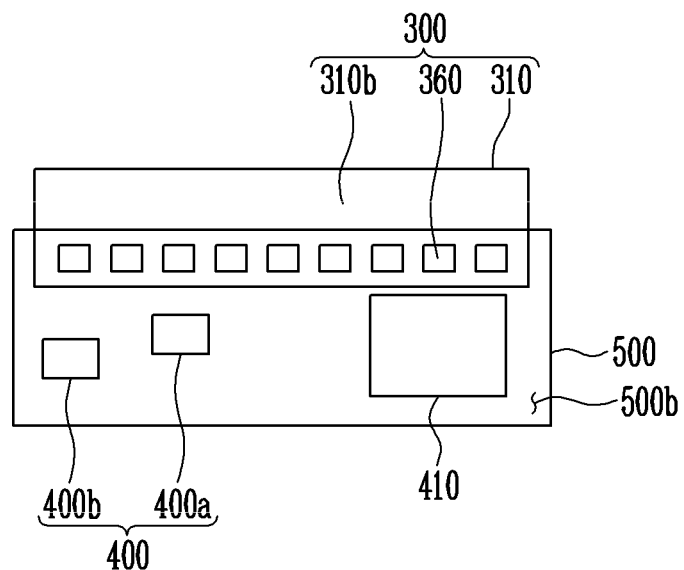
FIG. 11 is a plan view schematically illustrating a semiconductor device and a chip on film, which are shown in FIG. 9.

FIG. 9 is a schematic perspective view of a display device according to another embodiment of the present disclosure. FIG. 10 is a sectional view taken along the line III-III' of FIG. 9. FIG. 11 is a plan view schematically illustrating a semiconductor device and a chip on film, which are shown in FIG. 9.

In this embodiment, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 9 to 11, the display device 1' according to some example embodiments of the present disclosure may be provided in a rectangular shape having a pair of long sides and a pair of short sides. In some example embodiments of the present disclosure, for convenience of description, the extending direction of the short side of the display device 1' is represented as a first direction DR1, the extending direction of the long side of the display device 1' is represented as a second direction DR2, and a direction orthogonal to the first and second directions DR1 and DR2 is represented as a third direction DR3.

The display device 1' may include a printed circuit board 100, a display panel 200 overlapping with the printed circuit board 100 in the thickness direction DR3, and a chip on film 500.

The printed circuit board 100 may include a base circuit substrate 101 and at least one circuit element 120 arranged and/or mounted on one surface of the base circuit substrate 101. The printed circuit board 100 may further include a wireless transmitting array (see 105 of FIG. 1) arranged and/or mounted on the on surface of the base circuit substrate 101.

The display panel 200 may include a display area DA in which a plurality of pixels (see PXL of FIG. 1) and a non-display area NDA surrounding at least one side of the display area DA. The display panel 200 may include a first substrate 201 and a second substrate 202.

In some example embodiments of the present disclosure, the display panel 200 may include a semiconductor device 300 located in the non-display area NDA of the first substrate 201 and the chip on film 500 connected to the semiconductor device 300. The display panel 200 may further include a wireless receiving array (see 205 of FIG. 1) arranged and/or mounted in the non-display area NDA.

At least one connection pad CPD may be arranged and/or mounted in the non-display area NDA of the display panel 200. The connection pad CPD may be electrically connected to the semiconductor device 300 to transfer various powers and/or signals, which are supplied from the semiconductor device 300, to the pixels PXL.

The semiconductor device 300 may include a semiconductor chip 310 including a semiconductor substrate (see 301 of FIG. 7), at least one first bump 330 formed on a lower surface 310a of the semiconductor chip 310, and at least one second bump 360 located on an upper surface 310b of the semiconductor chip 310.

The first bump 330 may be located on the lower surface 310a of the semiconductor chip 310 to be opposite to the connection pad CPD of the display panel 200, to be electrically connected to the connection pad CPD. In some embodiments, an adhesive layer ADL may be provided between the connection pad CPD and the first bump 330. The adhesive layer ADL may allow the display panel 200 and the semiconductor device 300 to be stably joined between the connection pads CPD and the first bump 330 when the display panel 200 and the semiconductor device 300 are bonded to each other.

The second bump 360 may be located on the upper surface 310b of the semiconductor chip 310, and be electrically connected to the chip on film 500. The second bump 360 and the chip on film 500 may be electrically connected through a soldering process, but the present disclosure is not limited thereto.

The chip on film 500 may include one surface 500a and the other surface 500b, which are opposite to each other in the third direction DR3 (e.g., the thickness direction). The one surface 500a of the chip on film 500 is a surface facing the semiconductor device 300, and may be a lower surface of the chip on film 500 when viewed on a section. The other surface 500b of the chip on film 500 may be an upper surface of the chip on film 500 when viewed on a section.

At least one passive element 400 and at least one active device 410 may be located on the other surface 500b of the chip on film 500.

The passive element 400 may include a first passive element 400a and a second passive element 400b. In some example embodiments, each of the first and second passive elements 400a and 400b may include a passive element having a large capacity. For example, the first passive element 400a may be a bypass capacitor, and the second passive element 400b may be a decoupling capacitor.

The active element 410 may be a power supply in the form of an IC in which two or more circuit elements are integrated in a component. However, the present disclosure is not limited thereto, and the active element 410 may be a memory chip in which a memory IC such as a DRAM is integrated.

At least one film pad may be arranged on the one surface 500a of the chip on film 500. The film pad may be arranged on one surface of the semiconductor device 300 to be opposite to the second bump 360 of the semiconductor device 300, to be electrically connected to the second bump 360. The one surface of the semiconductor device 300 may be the upper surface 310b of the semiconductor chip 310.

The chip on film 500 having the above-described configuration may be arranged and/or mounted on the top of the semiconductor device 300 to be electrically connected to the second bump 360 of the semiconductor device 300. When viewed on a section, the chip on film 500 may be arranged on the top of the semiconductor device 300. Also, the chip on film 500 may be electrically connected to the printed circuit board 100.

As described above, some passive elements 400 and some active elements 410, which have a relatively large capacity, are arranged and/or mounted directly on the chip on film 500 instead of the printed circuit board 100, and are electrically connected to the second bump 360 of the semiconductor chip 310, so that the spatial limit of the printed circuit board 100 can be minimized. Accordingly, the effective mounting area of the circuit element 120 arranged and/or mounted on the printed circuit board 100 can be sufficiently secured, and the distance between the circuit element 120 and an adjacent circuit element can be sufficiently maintained.

Figure 12:
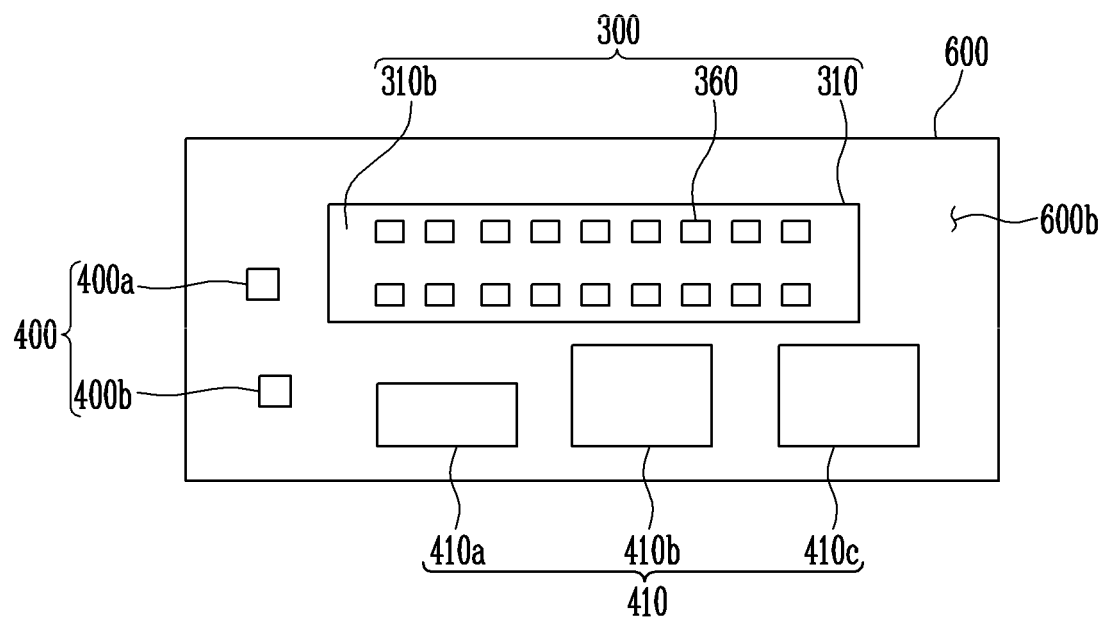
FIG. 12 is a plan view schematically illustrating a semiconductor device and a printed circuit board in a display device according to some example embodiments of the present disclosure.

FIG. 12 is a plan view schematically illustrating a semiconductor device and a printed circuit board in a display device according to still another embodiment of the present disclosure.

In FIG. 12, the display device according to the still another embodiment of the present disclosure may have a configuration substantially similar to that of the display device according to the above-described embodiment, except that a flexible printed circuit board is arranged and/or mounted on a second bump of a semiconductor device, so that the semiconductor device and the flexible printed circuit board are physically and/or electrically connected to each other.

Therefore, in relation to the display device according to FIG. 12, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIG. 12, the display device according to some example embodiments of the present disclosure may include a semiconductor device 300 and a flexible printed circuit board 600 arranged and/or mounted on the semiconductor device 300 to be electrically connected to the semiconductor device 300.

The semiconductor device 300 may include a semiconductor chip 310 and at least one second bump 360 located on an upper surface 310*b* of the semiconductor chip 310. At least one first bump may be located on a lower surface facing the upper surface 310*b* of the semiconductor chip 310.

The flexible printed circuit board 600 may be arranged and/or mounted on the semiconductor device 300, to be physically and/or electrically connected to the second bump 360 of the semiconductor device 300. To this end, at least one metal line and/or at least one circuit element may be located on the other surface facing one surface 600*b* of the flexible printed circuit board 600. The metal line and the circuit board may be located on one surface of the semiconductor device 300 to be opposite to the second bump 360 of the semiconductor device 300, to be electrically connected to the second bump 360. The one surface of the semiconductor device 300 may be the upper surface 310*b* of the semiconductor chip 310.

In some example embodiments of the present disclosure, the other surface of the flexible printed circuit board 600 is a surface facing the semiconductor device 300, and may be a lower surface of the flexible printed circuit board 600. The one surface 600*b* of the flexible printed circuit board 600 may be an upper surface facing the lower surface of the flexible printed circuit board 600.

At least one passive element 400 and at least one active element 410 may be located on the one surface 600*b* of the flexible printed circuit board 600.

The passive element 400 may include a first passive element 400*a* and a second passive element 400*b*. In some example embodiments, each of the first and second passive elements 400*a* and 400*b* may include a passive element having a large capacity. For example, the first passive element 400*a* may be a bypass capacitor, and the second passive element 400*b* may be a decoupling capacitor.

The active element 410 may include first to third active elements 410*a*, 410*b*, and 410*c*. In some example embodiments, the first to third active elements 410*a*, 410*b*, and 410*c* may be a power supply in the form of an IC in which two or more circuit elements are integrated in a component, but the present disclosure is not limited thereto. In some example embodiments, the first active element 410*a* may be a sensor circuit in the form of an IC, the second active element 410*b* may be a power supply in the form of an IC, and the third active element 410*c* may be a memory chip in which a memory IC is integrated.

The flexible printed circuit board 600 having the above-described configuration may be located and/or formed on the top of the semiconductor device 300 to be electrically connected to the second bump 360 of the semiconductor device 300. Also, the flexible printed circuit board 600 may be electrically connected to the printed circuit board 100 of FIG. 1.

As described above, some passive elements 400 having a relatively large capacity among the plurality of passive elements and some active elements 410 are mounted directly on the flexible printed circuit board 600 instead of the printed circuit board 100, and are electrically connected to the second bump 360 of the semiconductor chip 310, so that the spatial limit of the printed circuit board 100 can be minimized. Accordingly, the effective mounting area of the circuit element 120 located and/or mounted on the printed circuit board 100 can be sufficiently secured, and the distance between the circuit element 120 and an adjacent circuit element can be sufficiently maintained.

According to some example embodiments of the present disclosure, there can be provided a semiconductor device in which a plurality of bumps are respectively located on a first surface and a second surface of the semiconductor device, and some of electronic elements on a printed circuit board are mounted directly on the semiconductor device, so that the effective area of the printed circuit board can be secured, and a display device having the semiconductor device.

Further, according to some example embodiments of the present disclosure, there can be provided a display device having a printed circuit board that is recycled.

Aspects of some example embodiments have been described herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and their equivalents.

What is claimed is:

1. A display device comprising:
    a substrate having a display area and a non-display area:
    a radio receiving array in the non-display area of the substrate, the radio receiving array including a wireless receiving pad unit that is coupled to a wireless transmitting pad unit and configured to output a data reception signal by receiving wireless data, and a wireless data restoring unit configured to convert the data reception signal into restored image data: and
    a semiconductor device in the non-display area of the substrate, the semiconductor device configured to convert the restored image data into a voltage, the semiconductor device comprising:
a semiconductor chip including a substrate having a first surface and a second surface, which are opposite to each other;
a through hole penetrating the substrate;
a first conductive pad on the first surface of the substrate;
a first bump formed over and electrically connected to the first conductive pad;
a second conductive pad on the second surface of the substrate;
a second bump formed over and electrically connected to the second conductive pad; and
a connection electrode buried in the through hole, the connection electrode electrically connecting the first bump and the second bump.

2. The semiconductor device of claim 1, wherein the first bump and the second bump have different sizes.

3. The semiconductor device of claim 2, wherein a size of the second bump is larger than a size of the first bump.

4. The semiconductor device of claim 3, comprising at least one passive element on the second bump.

5. The semiconductor device of claim 4, wherein the passive element includes at least one of a bypass capacitor and a decoupling capacitor.

6. The semiconductor device of claim 4, wherein the first and second bumps include at least one metal layer.

7. The semiconductor device of claim 6, further comprising:
a first conductive medium layer between the first bump and the first conductive pad; and
a second conductive medium layer between the second bump and the second conductive pad.

8. The semiconductor device of claim 1, further comprising
an insulating film disposed between an inner surface of the through hole and the connection electrode,
wherein the insulating film completely covers the inner surface of the through hole for blocking direct electrical connection between the connection electrode and the substrate.

9. The semiconductor device of claim 8, wherein, in a plan view, the first conductive pad overlaps the connection electrode, the insulating film, and a portion of the substrate outside the through hole.

10. A display device comprising:
a substrate having a display area and a non-display area;
a printed circuit board including a transmitting controller configured to output input image data, a wireless data generator configured to convert the input image data into a data transmission signal, and a wireless transmitting pad unit configured to wirelessly transmit the data transmission signal as wireless data, the printed circuit board being separated from the substrate;
a radio receiving array in the non-display area of the substrate, the radio receiving array including a wireless receiving pad unit that is coupled to the wireless transmitting pad unit and configured to output a data reception signal by receiving the wireless data, and a wireless data restoring unit configured to convert the data reception signal into restored image data; and
a semiconductor device in the non-display area of the substrate, the semiconductor device configured to convert the restored image data into a voltage,
wherein the semiconductor device includes:
a semiconductor chip including a semiconductor substrate having a first surface and a second surface, which are opposite to each other;
a through hole penetrating the semiconductor substrate;
a first conductive pad on the first surface of the semiconductor substrate;
a first bump formed over and electrically connected to the first conductive pad;
a second conductive pad on the second surface of the semiconductor substrate; and
a second bump formed over and electrically connected to the second conductive pad.

11. The display device of claim 10, further comprising a connecting electrode buried in the through hole, the connection electrode electrically connecting the first bump and the second bump.

12. The display device of claim 11, wherein the first bump and the second bump have different sizes.

13. The display device of claim 12, wherein a size of the second bump is larger than a size of the first bump.

14. The display device of claim 13, comprising at least one passive element on the second bump of the semiconductor device.

15. The display device of claim 14, wherein the passive element includes at least one of a bypass capacitor and a decoupling capacitor.

16. The display device of claim 10, wherein the first and second bumps include at least one metal layer.

17. The display device of claim 16, further comprising a chip on film on the semiconductor device and electrically connected to the second bump.

18. The display device of claim 17, wherein at least one passive element is on one surface of the chip on film.

19. The display device of claim 18, wherein one side surface of the chip on film is connected to the printed circuit board, and the semiconductor device and the printed circuit board are electrically connected through the chip on film.

20. The display device of claim 16, further comprising a flexible printed circuit board on the semiconductor device and electrically connected to the second bumps.

21. The display device of claim 20, wherein at least one passive element and at least one active element are on one surface of the flexible printed circuit board.

22. The display device of claim 10, wherein the substrate includes a lower surface and an upper surface, which are opposite to each other,
wherein the semiconductor device is in the non-display area on the upper surface of the substrate.

* * * * *